(12) United States Patent
Ikuta

(10) Patent No.: US 7,796,667 B2
(45) Date of Patent: Sep. 14, 2010

(54) TWO-DIMENSIONAL SURFACE-EMITTING LASER ARRAY

(75) Inventor: Mitsuhiro Ikuta, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 110 days.

(21) Appl. No.: 12/234,037

(22) Filed: Sep. 19, 2008

(65) Prior Publication Data

US 2009/0086786 A1 Apr. 2, 2009

(30) Foreign Application Priority Data

Sep. 27, 2007 (JP) ............................. 2007-250663

(51) Int. Cl.
*H01S 5/00* (2006.01)

(52) U.S. Cl. ............ 372/50.124; 372/50.1; 372/50.121; 372/50.122; 372/50.123

(58) Field of Classification Search ............... 372/50.12, 372/50.121–50.124
See application file for complete search history.

(56) References Cited

U.S. PATENT DOCUMENTS 5,848,087 A 12/1998 Iwasa et al. .................... 372/50
6,144,685 A 11/2000 Iwasa et al. .................... 372/50
2008/0107145 A1 5/2008 Hori et al. ...................... 372/99
2008/0112442 A1 5/2008 Ikuta ............................ 372/19
2008/0117942 A1 5/2008 Nagatomo et al. ............ 372/19

FOREIGN PATENT DOCUMENTS

JP 2001-350111 A 12/2001
JP 2007-242686 A 9/2007

*Primary Examiner*—Minsun Harvey
*Assistant Examiner*—Tod T Van Roy
(74) *Attorney, Agent, or Firm*—Fitzpatrick, Cella, Harper & Scinto

(57) ABSTRACT

Provided is a two-dimensional surface-emitting laser array that enables to dispose more elements in a smaller area and enables compact size, high resolution, and high speed thereof. The two-dimensional surface-emitting laser array includes surface-emitting laser elements arranged in a two-dimensional manner of m rows and n columns (m is an integer of two or larger, and n is an integer of three or larger). The interval between mesas for arranging electrical wirings for individually driving the surface-emitting laser elements is assigned so that the interval in the m row direction increases according to the number of the electrical wirings passing through between the mesas.

3 Claims, 5 Drawing Sheets

TWO-DIMENSIONAL SURFACE-EMITTING LASER ARRAY

BACKGROUND OF THE INVENTION

1. Field of the Invention

The present invention relates to a two-dimensional surface-emitting laser array. In particular, the present invention relates to a two-dimensional surface-emitting laser array that is used as a multibeam light source for an electrophotographic type image forming apparatus.

2. Description of the Related Art

A multibeam scanning device that is used for an electrophotographic type image forming apparatus condenses multiple beams from a multibeam light source as multiple light spots onto a surface to be scanned as follows.

More specifically, multiple beams from a multibeam light source having multiple light emission points are deflected simultaneously by a common light deflector (e.g., a polygon mirror), and the deflected multiple beams are condensed by a common scanning optical system onto a surface to be scanned as multiple light spots that are separated from each other in a sub scanning direction. Then, each of the light sources is driven according to an image signal so that multiple beams are scanned at one time for generating a two-dimensional image pattern.

Since this multibeam scanning device scans x ($\geqq 2$) beams simultaneously, it can scan the beams at a speed x times a speed of a single beam scanning device if the scanning speed of the light spot is the same as that of the single beam scanning device. In other words, it is possible to speed up image processing.

In addition, if a scan line interval on a surface to be scanned is made to be 1/x times that of a single beam scanning device, it is possible to obtain an image having a resolution x times higher than that of the single beam scanning device in the scanning line direction.

In this way, the use of the multibeam as a light source in an electrophotographic type image forming apparatus is very effective in that an image can be formed with high resolution at high speed. As the number of the beams is increased, the effect thereof becomes larger.

Conventionally, a two-dimensional surface-emitting laser array disclosed in Japanese Patent Application Laid-Open No. 2001-350111 is known as one of the multibeam light sources of the electrophotographic type image forming apparatus described above.

Here, an arrangement of laser elements will be described in respect to the two-dimensional surface-emitting laser array that is used for the electrophotographic apparatus of the conventional example.

FIG. 4 is a diagram for illustrating an arrangement of laser elements of the two-dimensional surface-emitting laser array.

In the following description of a method of forming an image, it is a precondition that the surface to be scanned moves in a direction substantially perpendicular to the scan line, and that the direction of the scan line is referred to as a "main scanning direction" while the direction substantially perpendicular to the main scanning direction within the surface to be scanned, i.e., a feeding direction of the surface to be scanned is referred to as a "sub scanning direction".

FIG. 4 illustrates a two-dimensional surface-emitting laser array 400, and a surface-emitting laser 410.

Then, a two-dimensional pattern of the light emission spots (one spot corresponds to one surface-emitting laser element) of the surface-emitting lasers 410 is defined by a base line U2 in the main scanning direction and a base line U1 in the sub scanning direction.

The light emission spots on in the first column are m light emission spots arranged linearly on the base line U1 with a first interval P1.

In addition, the light emission spots in the (k+1)th column are arranged with a second interval P2 from the light emission spots on the k th column ($1 \leqq k < n$) along a base line A in a direction that is not perpendicular to the base line U1. In this way, the light emission spots are arranged until the n th column.

Here, the angle formed between the base line A and the main scanning direction (base line U2) is denoted by $\theta$, and the component in the direction perpendicular to the main scanning direction of the interval between adjacent light emission spots on the base line A is denoted by P0. Then, it follows that "P0=P2×sin $\theta$", and P2 is determined so as to satisfy "P0×n=P1".

As a result, m×n light emission spots are arranged one by one on m×n adjacent base lines U2 with the interval P0.

Note that the interval D between the columns in the main scanning direction is "D=P2×cos $\theta$".

Hereinafter, as indicators of the m×n light emission spots for description, expressions of one row and one column to m rows and n columns are used as illustrated in FIG. 4. For instance, a two-dimensional array of three rows and eight columns is illustrated in FIG. 4.

Multiple beams emitted from the two-dimensional surface-emitting laser array of the m rows and n columns formed as described above are condensed and scanned on a photosensitive member by a common scanning optical system (the lateral magnification in the sub scanning direction is set to Q times), so that m×n scan lines with an interval of Q×P0 are obtained.

Recently, there is an increasing demand for compact size, high resolution, and high speed of such a two-dimensional surface-emitting laser array that is used as a multibeam light source of an image forming apparatus.

In order to meet such request, it is necessary to arrange many elements in a small array area.

In other words, it is necessary to decrease the array area for realizing a compact size of the two-dimensional surface-emitting laser array. In addition, it is necessary to decrease the scan line interval for realizing high resolution of the two-dimensional surface-emitting laser array, and to increase the number of elements for realizing high speed of the two-dimensional surface-emitting laser array.

However, if the number of elements is increased, such a situation will occur that multiple electrical wirings for element drive should be arranged in some array interstices.

Therefore, if the array area is decreased, the array interstices are also narrowed so that it is difficult to arrange multiple electrical wirings.

Accordingly, it is necessary to secure intervals for arranging the multiple electrical wirings in the array interstices. However, if all the array interstices are of the same interval like the conventional structure, the interval sufficient for one single electrical wiring is the same as that for the multiple electrical wirings. Therefore, in such case there is a limitation in decreasing the array area.

Next, it will be described in more. specifically that the array area should be decreased for realizing a compact two-dimensional surface-emitting laser array as described above. As means for realizing a compact size thereof, a method of downsizing a casing of the device is mentioned.

As a method of downsizing a casing of the device, there is a method of shortening the optical path length of the scanning optical system. In order to realize this, it is possible to use a method of increasing the magnification of the scanning optical system.

However, if the magnification is increased, the scan line interval for the device necessary for obtaining the same scan line interval (i.e., same resolution) on a surface to be scanned is decreased according to the magnification thereof.

This means that the elements on the device become dense in the sub scanning direction (i.e., P0 becomes small).

If the P0 becomes small, P1 also becomes small. If P1 becomes smaller than the size of the surface-emitting laser element (desirably f20 microns or larger for obtaining relatively large emission intensity and good heat dissipation), the surface-emitting laser elements cannot be arranged.

In this case, the element interval can be secured in the sub scanning direction by increasing the number of elements in a direction other than the sub scanning direction in a two-dimensional grid array of the device. In other words, since "P1 (element interval on the same column)=n (number of elements belonging to the same row)×P0 (element interval in the sub scanning direction)" is a necessary condition for the m×n scan lines to have the equal intervals, it is sufficient to increase n for increasing P1.

However, in order to conduct image formation of light from the two-dimensional surface-emitting laser array on a surface to be scanned with sufficient position accuracy, it is necessary to use a part with an aberration within a permissible range in the scanning optical system.

More specifically, it is necessary to use a center of an optical element such as a lens as much as possible.

This means that a region where the light emission spots are located is required to be controlled to be of a certain area or smaller in the two-dimensional surface-emitting laser array.

In other words, there is a limitation in extending the array size in the main scanning direction (D×(n−1)) even in the case where n is increased.

For those reasons, it is necessary to decrease the array area for realizing a compact size of the two-dimensional surface-emitting laser array.

Next, it will be described in more specifically that if the number of elements is increased, multiple electrical wirings for element drive should be arranged in the array interstices, and that if the array area is decreased, it should be difficult to arrange the multiple electrical wirings as described above.

FIG. 5 illustrates a diagram for describing the difficulty in arranging the multiple electrical wirings as described above. In FIG. 5, the electrical wirings and pad electrodes are illustrated only partially for simple illustration.

The laser elements of a two-dimensional surface-emitting laser array that is used for an electrophotographic type image forming apparatus are supplied with current via individual electrical wirings and are driven individually.

More specifically, individual laser elements 420 of a two-dimensional surface-emitting laser array 401 are connected to corresponding pad electrodes 440 located in the peripheral portion of the array via individual electrical wirings 430 as illustrated in FIG. 5.

Here, if the two-dimensional surface-emitting laser array is made up of multiple elements, the number of electrical wirings for individually driving the elements is also increased corresponding to the number of the elements. Since the pad electrodes are located in the peripheral portion of the array, multiple electrical wirings for element drive should be arranged in some array interstices in some cases if the number of elements is increased.

In FIG. 5, for instance, multiple electrical wirings should be arranged in the interstices of a region 450.

For instance, if "((m−4)(n−4)>8" in a two-dimensional surface-emitting laser array that is used by individually driving m row and n column arrays (m≧5, n≧5), there is always an array interstice through which two electrical wirings pass.

This is because that since there are only (2m+2n−4) laser elements on the outermost peripheral portion of the array while there are (m−2)(n−2) elements inside thereof, if "(m−4)(n−4)>8", the number of the inside elements will exceed the number of the outside elements.

The electrical wiring is usually made of a metal. If the width of the electrical wiring is small, the electrical wiring will be broken easily by electromigration.

Therefore, the electrical wiring for driving the surface-emitting laser that is usually driven by current of a few milliamperes is required to have a width of a few microns, for instance.

In addition, if the distance between electrical wirings is too small, crosstalk between electrical wirings may occur, which causes a serious influence on the image forming. Therefore, it is difficult to decrease the distance between elements in which multiple electrical wirings are arranged.

For those reasons, it is difficult to dispose many elements in a multi-element array having a small area because of the limitation of the electrical wirings.

SUMMARY OF THE INVENTION

The present invention has been made in view of the above problems, and it is an object of the present invention to provide a two-dimensional surface-emitting laser array that enables to dispose more elements in a smaller area and enables a compact size, high resolution, and high speed thereof.

The present invention provides a two-dimensional surface-emitting laser array having the following structure.

A two-dimensional surface-emitting laser array of the present invention is a two-dimensional surface-emitting laser array having multiple surface-emitting laser elements arranged in a compact and narrow area in a two-dimensional manner of m rows and n columns (m is an integer of two or larger, and n is an integer of three or larger), in which the interval between mesas for arranging electric wirings for driving the surface-emitting laser elements individually is assigned so that the interval in the m row direction increases according to the number of electric wirings passing through between the mesas.

According to the present invention, it is possible to realize a two-dimensional surface-emitting laser array that enables to dispose more elements in a smaller area and enables a compact size, high resolution, and high speed thereof.

Further features of the present invention will become apparent from the following description of exemplary embodiments with reference to the attached drawings.

DESCRIPTION OF THE EMBODIMENTS

According to the present invention, it is possible to realize a two-dimensional surface-emitting laser array that enables to dispose more elements in a smaller area and can be used as a multibeam light source of an image forming apparatus. This is based on the following finding by the inventor of the present invention.

The inventor found after earnest studies that an electrical wiring pattern should be designed first and then an element pattern should be optimized for a two-dimensional surface-emitting laser array that is used for an electrophotographic apparatus, instead of designing the electrical wiring pattern according to the element pattern.

Here, in the two-dimensional surface-emitting laser array used for the electrophotographic apparatus, it is not necessary that the light emission spots be arranged with equal intervals in the main scanning direction.

In other words, it is possible to design the element interval to be large in a part having many electrical wirings and to be small in a part having a few electrical wirings, so that multiple elements can be arranged while controlling the array size as a whole.

Figure 4:
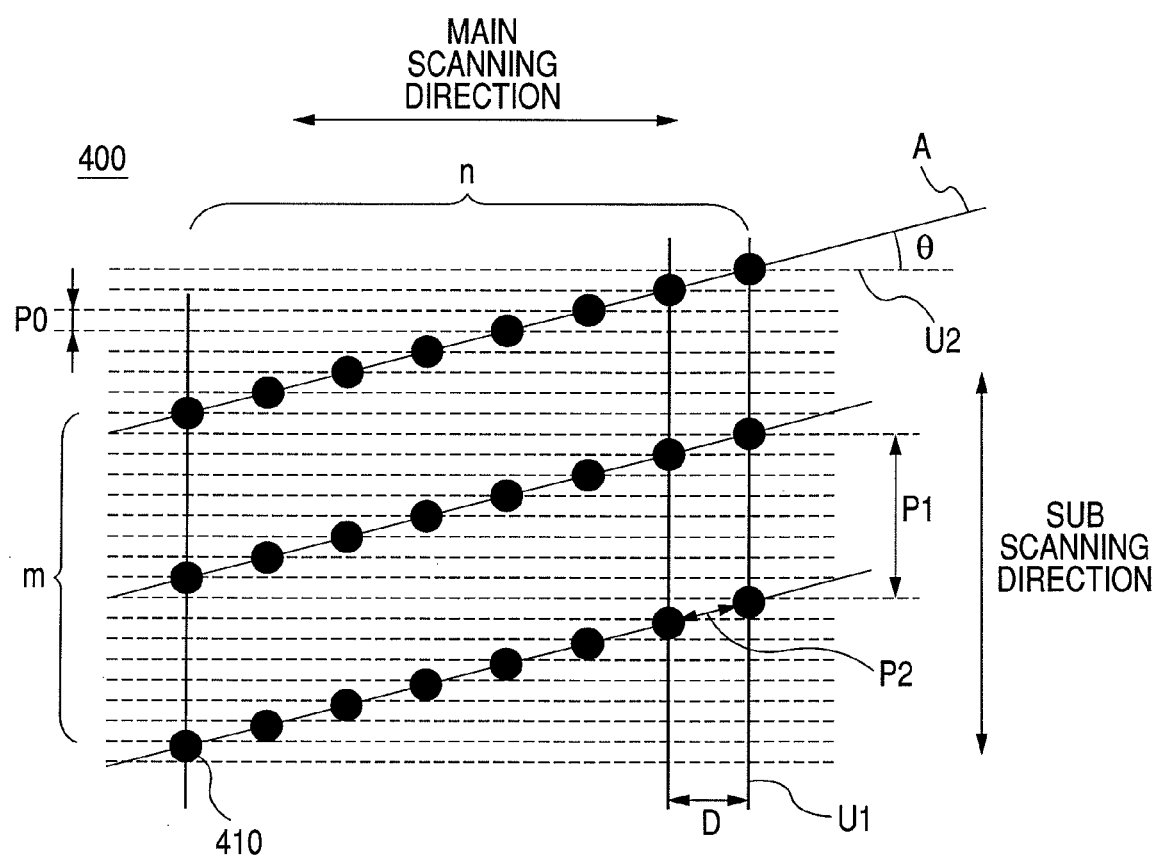
FIG. 4 is a diagram for describing an arrangement of laser elements in a two-dimensional surface-emitting laser array that is used for an electrophotographic apparatus of a conventional example.
Figure 5:
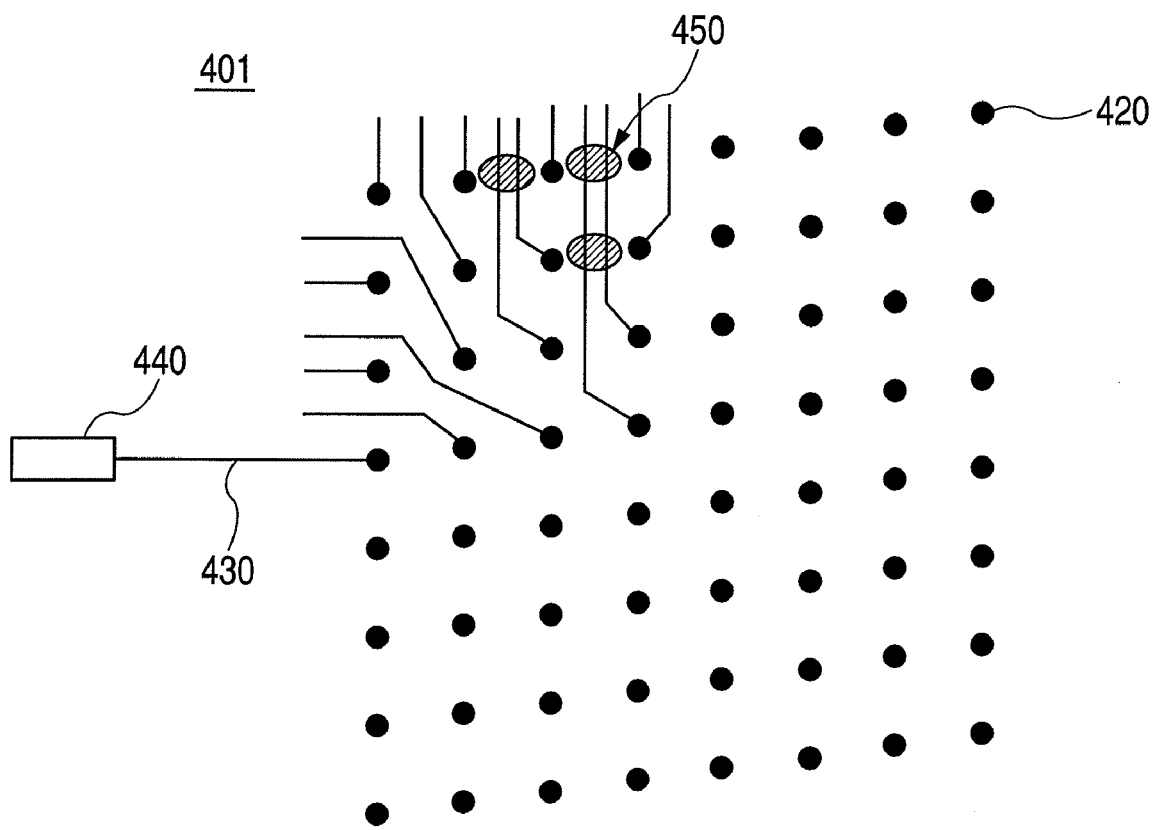
FIG. 5 is a diagram for showing that it is difficult to arrange multiple electrical wirings if an array area is decreased in the conventional example.

More specifically, the grid intervals D of the columns of the two-dimensional surface-emitting laser array illustrated in FIG. 4 are not fixed to be the same value as described above, but are determined according to the number of electrical wirings passing through between the columns of the array.

Based on the finding described above, the two-dimensional surface-emitting laser array having multiple surface-emitting laser elements arranged in a compact and narrow area in a two-dimensional manner of m rows and n columns (m is an integer of two or larger, and n is an integer of three or larger) has a newly found structure in which the interval between mesas for arranging electrical wirings for individually driving the surface-emitting laser elements is assigned so that the interval in the m row direction increases according to the number of electrical wirings passing through between the mesas.

More specifically, the two-dimensional surface-emitting laser array as an embodiment of the present invention includes the surface-emitting laser elements arranged in a two-dimensional manner of m rows and n columns (m is an integer of two or larger, and n is an integer of three or larger), and is used as a light source for forming a latent image on a photosensitive member provided to an electrophotographic apparatus, The interval between a jth column and a (j+1)th column in the m row direction in the mesa is denoted by $D_j$, the number of the electrical wirings passing through between the surface-emitting laser element on the ith row and jth column and the surface-emitting laser element on the ith row and (j+1)th column ($1 \leq i \leq m$, $1 \leq j \leq n-1$) is denoted by $F_{ij}$, and a set comprised of elements $D_j$ j of which satisfies $C_j = T$ ($1 \leq j \leq n-1$, T is a positive integer) is denoted by $g_T$ where $C_j$ is a maximum value among $F_{1j}, F_{2j}, \ldots F_{mj}$.

Then, in the case where at least one pair of a positive integer T1 and a positive integer T2 satisfying 0<T1<T2 exists where neither a set $g_{T1}$ nor a set $g_{T2}$ is an empty set, a minimum value of a wiring width of the electrical wirings of the surface-emitting laser element is denoted by E, an element having a minimum value among the elements of the set $g_T$ is denoted by $S_T$, an average value of the elements of the set $g_T$ is denoted by $M_T$, and when neither the set $g_{T1}$ nor the set $g_{T2}$ is an empty set with respect to any two of the positive integer T1 and the positive integer T2 satisfying 0<T1<T2, the following expression (1) is satisfied:

$$S_{T2} - M_{T1} > E \times (T2 - T1) \tag{1}$$

In this case, a grid column interval for a part with many wirings is set to be larger than an interval necessary with respect to a difference of the number of wirings compared with an average value of grid column intervals at a part with few wirings. Therefore, if an array size that can be used for the main scanning direction is fixed, a limitation of an element arrangement because of being unable to allow the wirings to pass through can be relieved in the array arrangement of the present invention compared with the array arrangement in which the column intervals are equal. Therefore, it is possible to achieve an array having multiple elements in a smaller area.

Further, the two-dimensional surface-emitting laser array as another embodiment of the present invention has a structure, with respect to the two-dimensional surface-emitting laser array described above, in which the minimum value of the wiring width of the electrical wirings of the surface-emitting laser element is denoted by E, the element having the minimum value among the elements of the set $g_T$ is denoted by $S_T$, an element having a maximum value among the elements of the set $g_T$ is denoted by $L_T$, when neither the set $g_{T1}$ nor the set $g_{T2}$ is an empty set with respect to any two of the positive integer T1 and the positive integer T2 satisfying 0<T1<T2, the following expression (2) is satisfied:

$$S_{T2} - L_{T1} > E \times (T2 - T1) \tag{2}$$

In this case, every part with few wirings has a reduced interval compared with a part with many wirings. Therefore, a waste is reduced more than that in the first invention so that the limitation of the element arrangement due to the wirings can be further relieved. Here, the waste means that the two-dimensional surface-emitting laser array has a part having a large interval although there are a small number of wirings passing through between the adjacent rows. The present invention can achieve an array having multiple elements in a smaller area.

Further, with respect to the two-dimensional surface-emitting laser array described above, the two-dimensional surface-emitting laser array as another embodiment of the present invention has a structure in which all the elements $D_j$ belonging to the same set $g_T$ have the same value with respect to any positive integer among the positive integers T. In this case, the column interval of the array grid is fixed uniquely according to the number of wirings passing through between the grid columns. Therefore, the waste described above can be further reduced compared with the second invention.

In addition, the two-dimensional surface-emitting laser array that is used for the electrophotographic type image forming apparatus has a delay time of the light emission timing for the surface-emitting laser elements belonging to adjacent columns, which delay time is determined according to the interval of the adjacent columns.

Therefore, if the column interval of the array grid varies depending on the number of wirings passing through between the grid columns, there will be such a demerit that a circuit for controlling the light emission timing of each surface-emitting laser element becomes complicated more than that in the case where the array grid column intervals are equal.

However, according to this embodiment, the column interval of the array grid is fixed uniquely according to the number of wirings passing through between the grid columns. Therefore, a circuit for controlling the delay time can be simplified compared with the case where the column intervals of the array grid are unequal, so the demerit in the case where the array grid column intervals are equal can be relieved.

EXAMPLES

Hereinafter, examples of the present invention will be described.

Example 1

Example 1 illustrates a two-dimensional surface-emitting laser array to which the present invention is applied.

Figure 1:
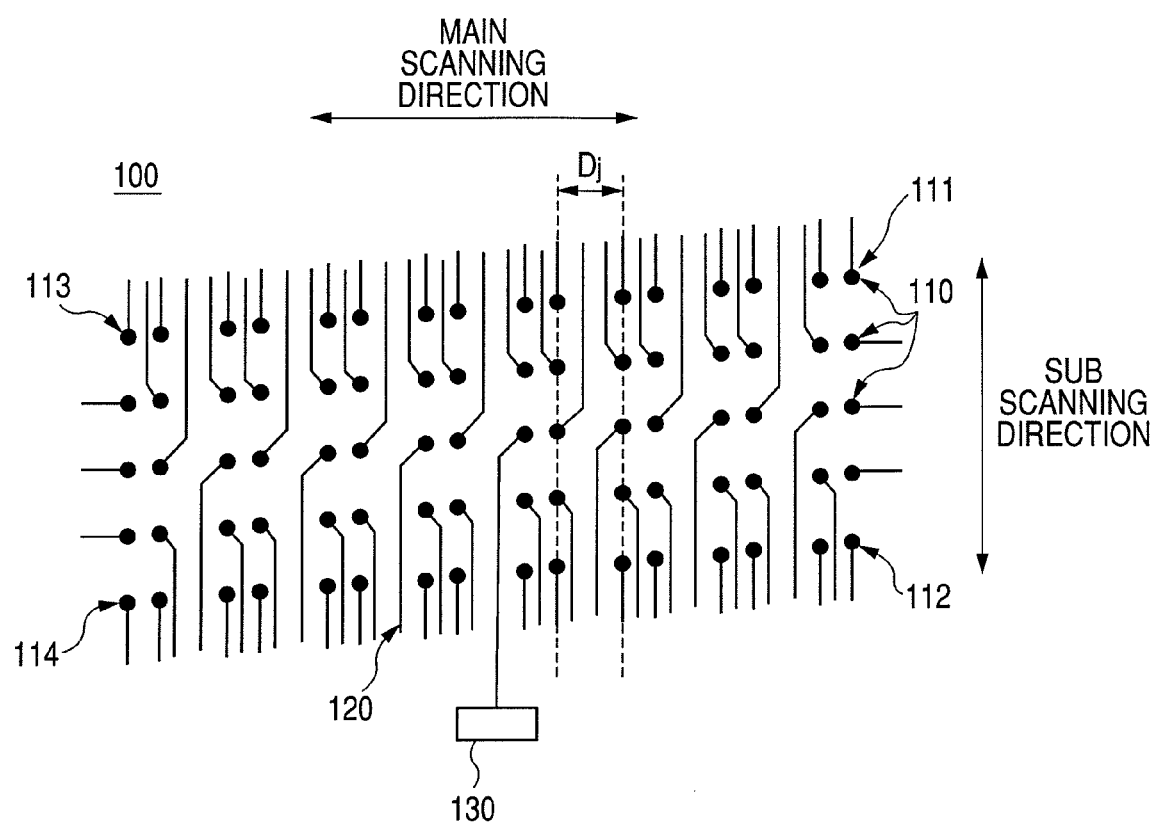
FIG. 1 is a diagram for describing a two-dimensional surface-emitting laser array according to Example 1 of the present invention.

FIG. 1 is a diagram for describing the two-dimensional surface-emitting laser array of this example.

FIG. 1 illustrates a two-dimensional surface-emitting laser array 100, a surface-emitting laser 110, surface-emitting lasers 111, 112, 113, and 114 positioned at four corners of a matrix, a wiring 120, and a pad electrode 130.

The two-dimensional surface-emitting laser array of this example includes 80 surface-emitting lasers 110 in total in 5 rows and 16 columns in the two-dimensional surface-emitting laser array 100 as illustrated in FIG. 1.

The rows and the columns of the two-dimensional surface-emitting laser array 100 will be defined from the upper right to the lower left for description.

More specifically, the surface-emitting lasers 111, 112, 113 and 114 positioned at the four corners of the matrix correspond to the elements on the grids of the first row and first column, the fifth row and first column, the first row and sixteenth column, and the fifth row and sixteenth column, respectively. The 80 surface-emitting lasers 110 in total are arranged with equal intervals in the sub scanning direction. In other words, 80 scan lines with equal intervals can be obtained on a surface to be scanned for forming an image. Each of the surface-emitting lasers 110 is connected electrically to a corresponding pad electrode 130 (only a part thereof is illustrated) via the wiring 120 for individual electric drive. Here, a minimum value of wiring widths of the wirings 120 is denoted by E.

The number of wirings passing through between the grid on the i th row and j th column and the grid on the i th row and (j+1)th column is denoted by $F_{ij}$.

Table 1 illustrates a table for $F_{ij}$ with respect to the two-dimensional pattern of the wiring 120 in the two-dimensional surface-emitting laser array 100 illustrated in FIG. 1.

TABLE 1

| $F_{ij}$ | | | | | | | | | | | | | | | | |
|---|---|---|---|---|---|---|---|---|---|---|---|---|---|---|---|---|
| 1 | 2 | 1 | 2 | 1 | 2 | 1 | 2 | 1 | 2 | 1 | 2 | 1 | 2 | 1 | | |
| 0 | 1 | 0 | 1 | 0 | 1 | 0 | 1 | 0 | 1 | 0 | 1 | 0 | 1 | 0 | | |
| 0 | 0 | 0 | 0 | 0 | 0 | 0 | 0 | 0 | 0 | 0 | 0 | 0 | 0 | 0 | | |
| 0 | 1 | 0 | 1 | 0 | 1 | 0 | 1 | 0 | 1 | 0 | 1 | 0 | 1 | 0 | | |
| 0 | 2 | 1 | 2 | 1 | 2 | 1 | 2 | 1 | 2 | 1 | 2 | 1 | 2 | 1 | | |

Further, a maximum value among $F_{1j}$ to $F_{5j}$ is denoted by $C_j$. Table 2 illustrates a table for $C_j$ with respect to the two-dimensional pattern of the wiring 120 in the two-dimensional surface-emitting laser array 100 illustrated in FIG. 1.

TABLE 2

| $C_j$ | 1 | 2 | 1 | 2 | 1 | 2 | 1 | 2 | 1 | 2 | 1 | 2 | 1 | 2 | 1 |
|---|---|---|---|---|---|---|---|---|---|---|---|---|---|---|---|

In the two-dimensional surface-emitting laser array 100 illustrated in FIG. 1, the grid interval between a j th column and a (j+1)th column is denoted by $D_j$.

In this example, $C_j$ can be 1 or 2. A set having elements $D_j$ where each j satisfies "$C_j=1$" is denoted by $g_1$, and a set having elements $D_j$ where each j satisfies "$C_j=2$" is denoted by $g_2$. More specifically, the set $g_1$ has elements of $D_1$, $D_3$, $D_5$, $D_7$, $D_9$, $D_{11}$, $D_{13}$ and $D_{15}$, and the set $g_2$ has elements of $D_2$, $D_4$, $D_6$, $D_8$, $D_{10}$, $D_{12}$ and $D_{14}$. Here, a minimum value among the elements of the set $g_2$ is denoted by $S_2$, and an average value of the elements of the set $g_1$ is denoted by $M_1$. Then, each $D_j$ is determined so that "$S_2-M_1>E$".

When each $D_j$ is determined in this way, it is possible to assign more space to the interstice through which two wirings pass than the case where an array size H (=$D_1+D_2+D_3+\ldots+D_{15}$) in the main scanning direction is the same and the same value (=H/15) is assigned to each $D_j$.

Therefore, this example enables to control the array size to be smaller than the array size in the main scanning direction that is necessary for two wirings to pass through the interstices in the case where the grid intervals between the adjacent columns are equal. In addition, even in the case of a large array size sufficient for the two wirings to pass through the interstices if the grid columns are arranged with equal intervals, the arrangement of this example enables crosstalk between wirings to be reduced more than that in the case where the grid columns are arranged with equal intervals.

In other words, according to the arrangement of this example, the smallest distance between wirings (distance between two wirings in a part where the two wiring pass through the interstice) can be set to be large, so that crosstalk between wirings can be reduced.

In addition, it is desirable to determine each $D_j$ so that "$S_2-L_1>E$" where a maximum value among the elements of the set $g_1$ is denoted by $L_1$.

In this case, the effect described above (that an array size can be reduced and that crosstalk between wirings can be reduced) becomes larger.

In addition, if each $D_j$ is determined so that every element of the set $g_1$ is equal to $L_1$ ($L_1$ is a minimum value of the interval necessary for disposing one wiring in the interstice), and that every element of the set $g_2$ is equal to $S_2$ ($S_2$ is a minimum value of the interval necessary for disposing two wirings in the interstice), the size of the two-dimensional surface-emitting laser array in the main scanning direction can be a minimum value.

It is natural that "$S_2-L_1>E$" is satisfied in this case, too.

This method is very effective for realizing a two-dimensional surface-emitting laser array by arranging as many surface-emitting laser elements as possible in a certain array size (in the main scanning direction).

Next, a method of manufacturing the two-dimensional surface-emitting laser array 100 of Example 1 illustrated in FIG. 1 will be described.

Figure 3:
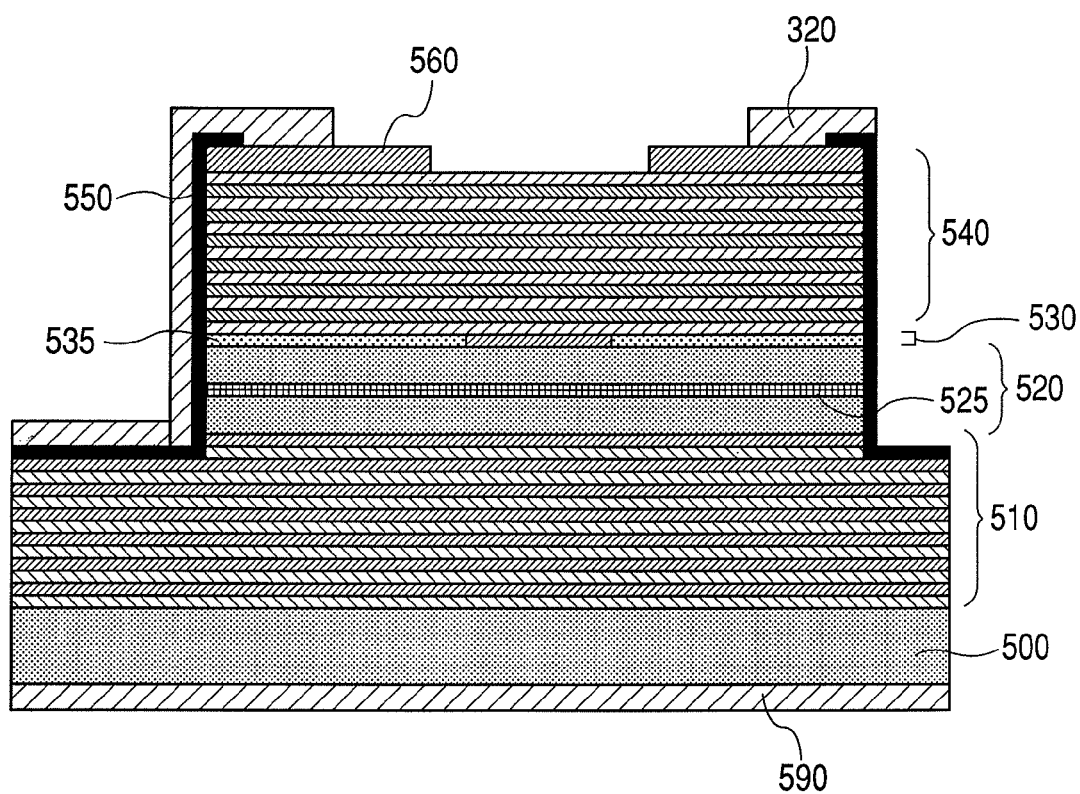
FIG. 3 is a diagram for describing a method of manufacturing the two-dimensional surface-emitting laser array according to Example 1 of the present invention.

FIG. 3 illustrates a cross section of one element of surface-emitting lasers 310 constituting the two-dimensional surface-emitting laser array 100.

As illustrated in FIG. 3, the surface-emitting laser 310 of this example has an n-type reflecting mirror 510 having a multilayer structure in which an $Al_{0.5}Ga_{0.5}As$ layer and an $Al_{0.9}Ga_{0.1}As$ layer are alternately layered on an n-GaAs semiconductor substrate 500.

In addition, it includes a cavity region 520 including a quantum well layer 525 made of GaInP/AlGaInP, an $Al_{0.98}Ga_{0.02}As$ current confined layer 530, and a p-type reflecting mirror 540 in which an $Al_{0.5}Ga_{0.5}As$ layer and an $Al_{0.9}Ga_{0.1}As$ layer are alternately layered.

In its manufacture, a part of a resonator including the upper multilayer reflecting mirror (p-type reflecting mirror) 540 and the $Al_{0.98}Ga_{0.02}As$ current confined layer 530 is removed by using a photolithography process and an etching process, so that a mesa structure is formed in array as illustrated in FIG. 1.

Then, an external selective oxidation process is performed on the $Al_{0.98}Ga_{0.02}As$ current confined layer 530, so that an oxide layer 535 is formed and a current confined structure is disposed.

The selective oxidation is performed at a substrate temperature of 480 degrees Celsius for 30 minutes in an atmosphere of steam, for instance.

After that, a ring-shaped p-side electrode 560 made of Ti/Au is formed on the surface of the p-type reflecting mirror 540, a insulator film 550 made of a $SiO_2$ deposited film is formed, and a part of the insulator film 550 is removed by etching so that a part of the p-side electrode 560 is exposed.

A wiring 320 and the pad electrode 130 made of Ti/Au for instance are formed for driving the surface-emitting laser 310 so as to be in contact with the p-side electrode 560, and an n-side electrode 590 made of AuGe/Au is formed on the back side of the semiconductor substrate 500 by vapor deposition.

This surface-emitting laser 310 emits a laser beam from the surface of the element perpendicularly to the substrate 500 when a positive carrier and a negative carrier are injected from the p-side electrode 560 and the n-side electrode 590, respectively.

As a specific size of the surface-emitting laser 310, the diameter of the mesa structure is set to 25 microns and the aperture diameter of the current confined structure is set to 5 microns, for instance.

The minimum value of the wiring width of the wiring 320 is set to 10 microns, for instance.

For the two-dimensional surface-emitting laser array 100, the elements $D_1$, $D_3$, $D_5$, $D_7$, $D_9$, $D_{11}$, $D_{13}$ and $D_{15}$ are set to 40 microns, and the elements $D_2$, $D_4$, $D_6$, $D_8$, $D_{10}$, $D_{12}$ and $D_{14}$ are set to 55 microns.

In addition, for the two-dimensional surface-emitting laser array 100, the surface-emitting lasers 310 are arranged with equal interval P0 viewed in the sub scanning direction.

The interval P0 is a result of dividing the scan line interval of a desired surface to be scanned by the lateral magnification in the sub scanning direction of the scanning optical system.

For instance, if the lateral magnification in the sub scanning direction of the scanning optical system is three times with the scan line interval being 4800 dpi (5.29 microns) on the surface to be scanned, the interval P0 becomes 1.76 microns.

Example 2

As Example 2, a two-dimensional surface-emitting laser array having a structure different from Example 1 will be described.

Figure 2:
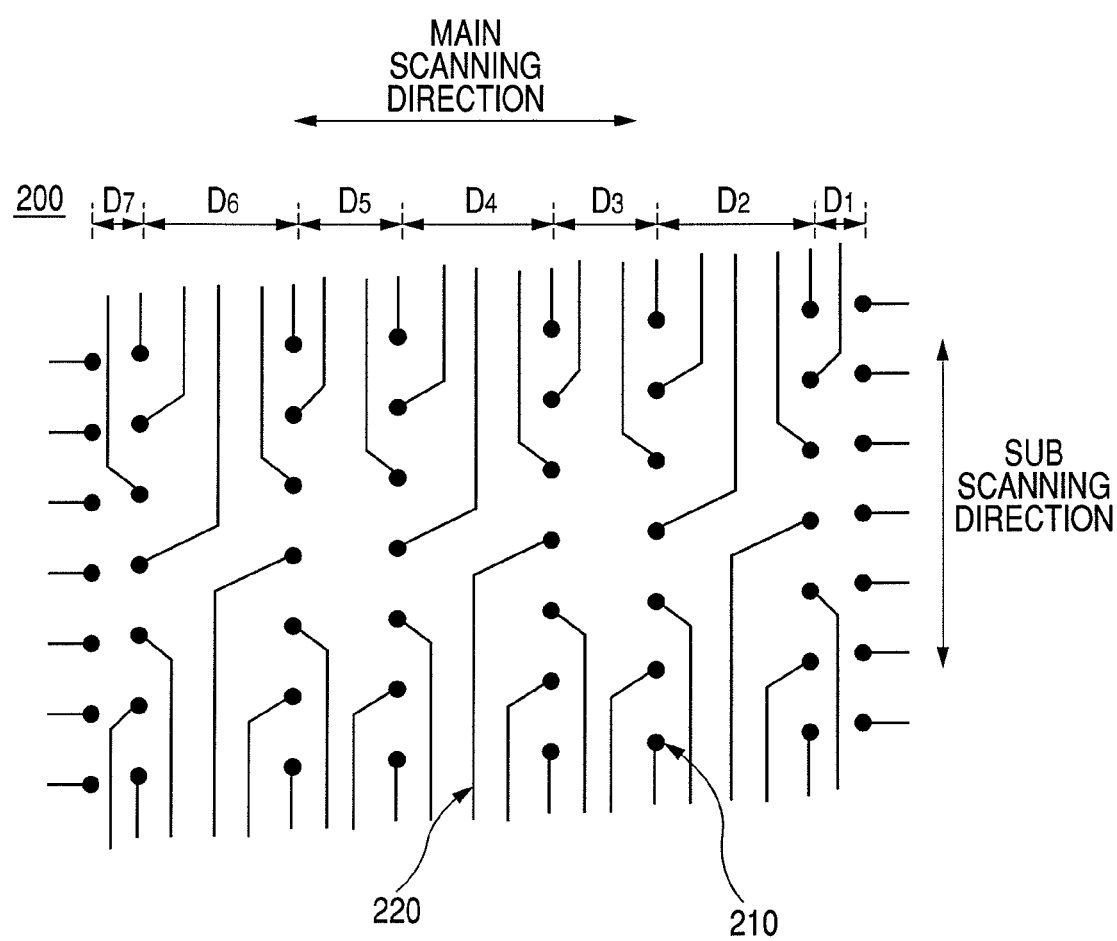
FIG. 2 is a diagram for describing a two-dimensional surface-emitting laser array according to Example 2 of the present invention.

FIG. 2 is a diagram for describing the two-dimensional surface-emitting laser array of this example.

FIG. 2 illustrates a two-dimensional surface-emitting laser array 200, a surface-emitting laser 210, and a wiring 220.

The two-dimensional surface-emitting laser array 200 of this example includes 56 surface-emitting lasers 210 in total in 7 rows and 8 columns as illustrated in FIG. 2.

Similarly to the case of Example 1, the rows and the columns of the two-dimensional surface-emitting laser array 200 will be defined from the upper right to the lower left.

The 56 surface-emitting lasers 210 in total are arranged with equal intervals in the sub scanning direction. In other words, 56 scan lines with equal intervals can be obtained on the surface to be scanned for forming an image.

Each of the surface-emitting lasers 210 is connected electrically to a corresponding pad electrode (not shown) via the wiring 220 for individual electric drive. Here, a minimum value of wiring widths of the wirings 220 is denoted by E.

The number of wirings passing through between the grid on the i th row and j th column and the grid on the i th row and (j+1)th column is denoted by $F_{ij}$, and a maximum value among $F_{1j}$ to $F_{7j}$ is denoted by $C_j$.

Table 3 and Table 4 respectively illustrate tables for $F_{ij}$ and $C_j$ of the wiring 220 in the two-dimensional surface-emitting laser array 200 illustrated in FIG. 2 with respect to the two-dimensional pattern.

TABLE 3

| $F_{ij}$ | | | | j | | | | |
|---|---|---|---|---|---|---|---|---|
| | 1 | 3 | 2 | 3 | 2 | 3 | 1 | |
| | 1 | 2 | 1 | 2 | 1 | 2 | 0 | |
| | 0 | 1 | 0 | 1 | 0 | 1 | 0 | |
| | 0 | 0 | 0 | 0 | 0 | 0 | 0 | i |
| | 0 | 1 | 0 | 1 | 0 | 1 | 0 | |
| | 0 | 2 | 1 | 2 | 1 | 2 | 1 | |
| | 1 | 3 | 2 | 3 | 2 | 3 | 1 | |

TABLE 4

| $C_j$ | | | | j | | | |
|---|---|---|---|---|---|---|---|
| | 1 | 3 | 2 | 3 | 2 | 3 | 1 |

The grid interval between a j th column and a (j+1)th column in the two-dimensional surface-emitting laser array 200 illustrated in FIG. 2 is denoted by $D_j$.

In this example, $C_j=1$ (j=1, 7), 2(j=3, 5), 3(j=2, 4, 6). Here, $D_j$ is determined according to $C_j$. More specifically, "$D_1=D_7=L_1$", "$D_3=D_5=L_2$", and "$D_2=D_4=D_6=L_3$". Here, $L_1$, $L_2$ and $L_3$ are positive values satisfying "$L_2-L_1>E$", "$L_3-L_2>E$", and "$L_3-L_1>2E$". Since the column interval of the array interstice is so set as to increase step by step as the number of wirings increases, it is possible to achieve an array having multiple elements in a smaller area similarly to the case of Example 1.

Note that the two-dimensional surface-emitting laser array of the present invention is not limited to the structures of the examples described above.

For instance, although the examples described above exemplify the two-dimensional surface-emitting laser array having laser elements with equal intervals one by one in the sub scanning direction, it may be an array that meets an interlaced scanning method. In other words, when the two-dimensional surface-emitting laser array is viewed in the sub scanning direction, the surface-emitting laser elements may not be necessarily arranged with equal intervals.

In addition, it may be an array that meets a method of multiple exposure in one scanning. In other words, when the two-dimensional surface-emitting laser array is viewed in the sub scanning direction, multiple laser elements may be disposed on one base line.

While the present invention has been described with reference to the exemplary embodiment, it is to be understood that the invention is not limited to the disclosed the exemplary embodiment. The scope of the following claims is to be accorded the broadest interpretation so as to encompass all such modifications and equivalent structures and functions.

This application claims the benefit of Japanese Patent Application No. 2007-250663, filed Sep. 27, 2007, which is hereby incorporated by reference in its entirety.

What is claimed is:

1. A two-dimensional surface-emitting laser array, comprising surface-emitting laser elements arranged in a two-dimensional manner of m rows and n columns, m being an integer of two or larger, n being an integer of three or larger, wherein an interval between a $j^{th}$ column and a $(j+1)^{th}$ column in an m row direction of the surface-emitting laser elements is denoted by $D_j$, wherein a number of electrical wirings passing between a surface-emitting laser element on an $i^{th}$ row and a $j^{th}$ column and a surface-emitting laser element on an $i^{th}$ row and a $(j+1)^{th}$ column is denoted by $F_{ij}$ (for $1 \leq i \leq m$, $1 \leq j \leq n-1$), wherein a set that includes elements $D_j$, j of which satisfy $C_j=T$ (for $1 \leq j \leq n-1$, where T is a positive integer) is denoted by $g_T$, where $C_j$ is a maximum value among $F_{1j}$, $F_{2j}$, ... $F_{mj}$, wherein at least one pair of a positive integer T1 and a positive integer T2 satisfying $0<T1<T2$ exists, where neither a set $g_{T1}$ nor a set $g_{T2}$ is an empty set, wherein a minimum value of a wiring width of electrical wirings of the surface-emitting laser elements is denoted by E, wherein an element having a minimum value among elements of a set $g_T$ is denoted by $S_T$, wherein an average value of the elements of the set $g_T$ is denoted by $M_T$, and wherein, for any two of the positive integers T1 and T2 satisfying $0<T1<T2$, neither the set $g_{T1}$ nor the set $g_{T2}$ is an empty set, and an expression $$S_{T2}-M_{T1}>E \times (T2-T1)$$

is satisfied.

2. A two-dimensional surface-emitting laser array according to claim 1, wherein an element having a maximum value among the elements of the set $g_T$ is denoted by $L_T$, and wherein, for any two of the positive integers T1 and T2 satisfying $0<T1<T2$, an expression $$S_{T2}-L_{T1}>E \times (T2-T1)$$

is satisfied.

3. A two-dimensional surface-emitting laser array according to claim 2, wherein all the elements $D_j$ belonging to a same set $g_T$ have a same value with respect to any positive integer among the positive integers T.

* * * * *